US012567804B2

(12) United States Patent
Jung et al.

(10) Patent No.: US 12,567,804 B2
(45) Date of Patent: Mar. 3, 2026

(54) SWITCHING SCHEME FOR OPERATING A THREE-LEVEL BUCK CONVERTER IN A TWO-LEVEL BUCK CONVERTER MODE

(71) Applicant: QUALCOMM Incorporated, San Diego, CA (US)

(72) Inventors: Sanghwa Jung, Los Gatos, CA (US); Chunping Song, Palo Alto, CA (US)

(73) Assignee: Qualcomm Incorporated, San Diego, CA (US)

( * ) Notice: Subject to any disclaimer, the term of this patent is extended or adjusted under 35 U.S.C. 154(b) by 311 days.

(21) Appl. No.: 18/189,810

(22) Filed: Mar. 24, 2023

(65) Prior Publication Data

US 2024/0322686 A1      Sep. 26, 2024

(51) Int. Cl.
| | |
|---|---|
| *H02M 3/158* | (2006.01) |
| *H02M 1/00* | (2006.01) |
| *H02M 3/07* | (2006.01) |
| *H02M 7/483* | (2007.01) |
| *H03K 17/687* | (2006.01) |

(52) U.S. Cl.
CPC ......... *H02M 3/158* (2013.01); *H02M 1/0032* (2021.05); *H02M 3/07* (2013.01); *H02M 7/4837* (2021.05); *H03K 17/687* (2013.01)

(58) Field of Classification Search
CPC ...... H02M 3/158; H02M 3/07; H02M 1/0032; H02M 1/0095; H02M 7/4837; H03K 17/687
See application file for complete search history.

(56) References Cited

U.S. PATENT DOCUMENTS

| | | | |
|---|---|---|---|
| 11,557,970 B2 | 1/2023 | Lidsky et al. | |
| 2016/0118887 A1* | 4/2016 | Zhang | H02M 3/158 |
| | | | 323/271 |
| 2021/0067033 A1* | 3/2021 | Jing | H02M 3/158 |
| 2021/0242771 A1* | 8/2021 | Chen | H02M 3/07 |
| 2022/0376616 A1* | 11/2022 | Hu | H02M 3/07 |
| 2023/0006555 A1* | 1/2023 | Jung | H02M 3/07 |
| 2023/0353036 A1* | 11/2023 | Rizzolatti | H02M 3/06 |

OTHER PUBLICATIONS

International Search Report and Written Opinion—PCT/US2024/017850—ISA/EPO—Jun. 19, 2024.

* cited by examiner

*Primary Examiner* — Jue Zhang
*Assistant Examiner* — Jye-June Lee
(74) *Attorney, Agent, or Firm* — Patterson & Sheridan LLP

(57) ABSTRACT

Certain aspects of the present disclosure generally relate to a three-level buck converter operating in a two-level buck converter mode with a delay between deactivating transistors when transitioning between charge and discharge phases. For example, certain aspects provide a power supply circuit generally including: a first transistor and a second transistor coupled between an input node of the power supply circuit and a switching node of the power supply circuit; a third transistor and a fourth transistor coupled between a reference potential node of the power supply circuit and the switching node of the power supply circuit; and logic configured to control activation states of the first transistor, the second transistor, the third transistor, and the fourth transistor. In some aspects, the activation states of the first transistor and the second transistor are configured to be switched at different times between the charge phase and the discharge phase.

24 Claims, 11 Drawing Sheets

800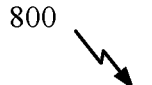

802

BIAS A FIRST TRANSISTOR AND A SECOND TRANSISTOR IN ACTIVATED STATES DURING A CHARGE PHASE OF THE POWER SUPPLY CIRCUIT, THE FIRST TRANSISTOR AND THE SECOND TRANSISTOR BEING COUPLED BETWEEN AN INPUT NODE OF THE POWER SUPPLY CIRCUIT AND A SWITCHING NODE OF THE POWER SUPPLY CIRCUIT, THE SWITCHING NODE BEING COUPLED TO AN INDUCTIVE ELEMENT

804

SWITCH ACTIVATION STATES OF THE FIRST TRANSISTOR AND THE SECOND TRANSISTOR DURING DIFFERENT PERIODS BETWEEN THE CHARGE PHASE AND A DISCHARGE PHASE

806

BIAS A THIRD TRANSISTOR AND A FOURTH TRANSISTOR IN ACTIVATED STATES DURING THE DISCHARGE PHASE OF THE POWER SUPPLY CIRCUIT, THE THIRD TRANSISTOR AND THE FOURTH TRANSISTOR BEING COUPLED BETWEEN A REFERENCE POTENTIAL NODE OF THE POWER SUPPLY CIRCUIT AND THE SWITCHING NODE OF THE POWER SUPPLY CIRCUIT

FIG. 8

SWITCHING SCHEME FOR OPERATING A THREE-LEVEL BUCK CONVERTER IN A TWO-LEVEL BUCK CONVERTER MODE

TECHNICAL FIELD

Certain aspects of the present disclosure generally relate to electronic circuits and, more particularly, to a three-level buck converter.

BACKGROUND

A voltage regulator ideally provides a constant direct current (DC) output voltage regardless of changes in load current or input voltage. Voltage regulators may be classified as linear regulators or switching regulators. While linear regulators tend to be relatively compact, many applications may benefit from the increased efficiency of a switching regulator. A linear regulator may be implemented by a low-dropout (LDO) regulator, for example. A switching regulator (also known as a "switching converter" or "switcher") may be implemented, for example, by a switched-mode power supply (SMPS), such as a buck converter, a boost converter, a buck-boost converter, or a charge pump.

For example, a buck converter is a type of SMPS that may include: (1) a high-side switch coupled between a relatively higher voltage rail and a switching node, (2) a low-side switch coupled between the switching node and a relatively lower voltage rail, (3) and an inductor coupled between the switching node and a load. The high-side and low-side switches are typically implemented with transistors, although the low-side switch may alternatively be implemented with a diode.

Power management integrated circuits (power management ICs or PMICs) are used for managing the power scheme of a host system and may include and/or control one or more voltage regulators (e.g., buck converters and/or LDOs). A PMIC may be used in battery-operated devices, such as mobile phones, tablets, laptops, wearables, etc., to control the flow and direction of electrical power in the devices. The PMIC may perform a variety of functions for the device, such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects are directed towards a power supply circuit. The power supply circuit generally includes: a first transistor and a second transistor coupled between an input node of the power supply circuit and a switching node of the power supply circuit, the switching node being coupled to an inductive element; a third transistor and a fourth transistor coupled between a reference potential node of the power supply circuit and the switching node of the power supply circuit; and logic configured to control activation states of the first transistor, the second transistor, the third transistor, and the fourth transistor, such that: during a charge phase of the power supply circuit, the first transistor and the second transistor are configured to be in activated states, and the third transistor and the fourth transistor are configured to be in deactivated states; during a discharge phase of the power supply circuit, the first transistor and the second transistor are configured to be in deactivated states, and the third transistor and the fourth transistor are configured to be in activated states; and the activation states of the first transistor and the second transistor are configured to be switched at different times between the charge phase and the discharge phase.

Certain aspects are directed towards a method for operating a power supply circuit. The method generally includes: biasing a first transistor and a second transistor in activated states during a charge phase of the power supply circuit, the first transistor and the second transistor being coupled between an input node of the power supply circuit and a switching node of the power supply circuit, the switching node being coupled to an inductive element; switching activation states of the first transistor and the second transistor at different times between the charge phase and a discharge phase; and biasing a third transistor and a fourth transistor in activated states during the discharge phase of the power supply circuit, the third transistor and the fourth transistor being coupled between a reference potential node of the power supply circuit and the switching node of the power supply circuit.

Certain aspects are directed towards an apparatus for operating a power supply circuit. The apparatus generally includes: means for biasing a first transistor and a second transistor in activated states during a charge phase of the power supply circuit, the first transistor and the second transistor being coupled between an input node of the power supply circuit and a switching node of the power supply circuit; means for switching activation states of the first transistor and the second transistor at different times between the charge phase and a discharge phase; and means for biasing a third transistor and a fourth transistor in activated states during a discharge phase of the power supply circuit, the third transistor and the fourth transistor being coupled between a reference potential node of the power supply circuit and the switching node of the power supply circuit.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 8 is a flow diagram of example operations for supplying power, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
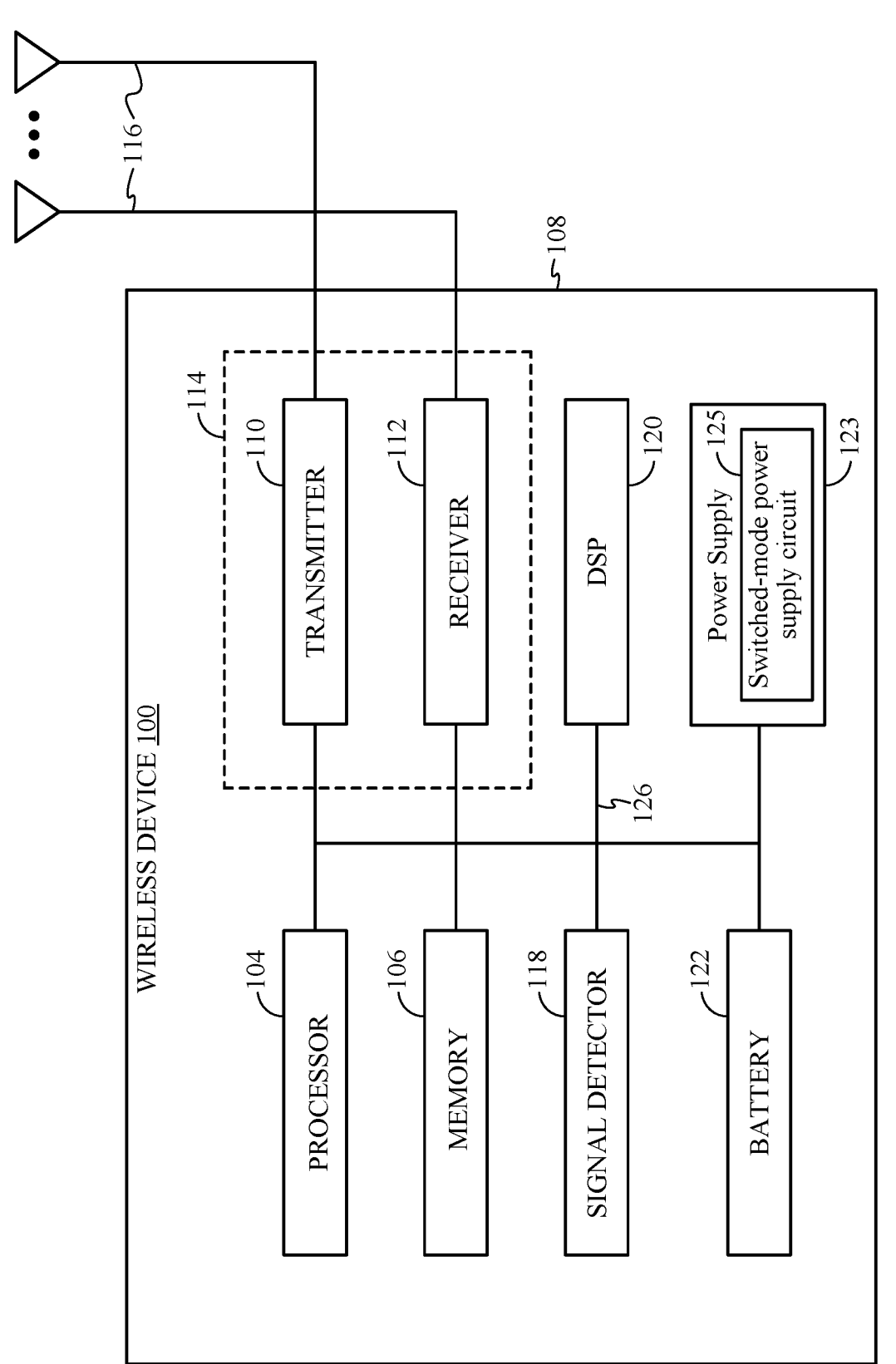
FIG. 1 illustrates a block diagram of an example device that includes a power supply system with at least one switched-mode power supply (SMPS) circuit, in which aspects of the present disclosure may be practiced.

Certain aspects of the present disclosure provide techniques and apparatus for operating a three-level buck converter in a two-level buck converter mode. For example, the three-level buck converter may be operated in the two-level buck converter mode during light load scenarios to reduce switching losses. When switching between a charge phase and a discharge phase in the two-level buck converter mode, the voltage at a switching node of the converter may drop to a negative voltage (e.g., equivalent to the sum of forward voltages of body diodes of two transistors). The negative voltage may cause reliability issues and may degrade power supply efficiency. Some aspects of the present disclosure provide a switching scheme for transitioning between the charge phase and the discharge phase to reduce the voltage drop during the transition, thereby increasing efficiency.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

As used herein, an "activation state" of a transistor generally refers to whether the transistor is turned on (e.g., biased in an activated state) or turned off (e.g., biased in a deactivated state).

An Example Device

It should be understood that aspects of the present disclosure may be used in a variety of applications. Although the present disclosure is not limited in this respect, the circuits disclosed herein may be used in any of various suitable apparatuses, such as in the power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCS), personal digital assistants (PDAs), and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, an Internet of things (IOT) device, a wearable device, a virtual reality (VR) or augmented reality (AR) device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122, which may be used to power the various components of the device 100 (e.g., when the device is disconnected from an external power source). The device 100 may also include a power supply system 123 for managing the power from the battery (or from one or more power ports for receiving external power) to the various components of the device 100. At least a portion of the power supply system 123 may be implemented in one or more power management integrated circuits (power management ICs or PMICs) The power supply system 123 may perform a variety of functions for the device 100 such as DC-to-DC conversion, battery charging, power-source selection, voltage scaling, power sequencing, etc. For example, the power supply system 123 may include one or more power supply circuits, which may include a switched-mode power supply circuit 125. The switched-mode power supply circuit 125 may be implemented by any of various suitable switched-mode power supply circuit topologies, such as a three-level buck converter, a divide-by-two (Div2) charge pump, or an adaptive combination power supply circuit, which can switch between operating in a three-level buck converter mode and a two-level buck converter mode, as described below. In some cases, the power supply system 123 may include a battery charging circuit (e.g., a master-slave battery charging circuit) for charging the battery 122. The battery charging circuit may be implemented by the switched-mode power supply circuit 125, for example.

The various components of the device 100 may be coupled together by a bus system 126, which may include a power bus, a control signal bus, and/or a status signal bus in addition to a data bus. Additionally or alternatively, various combinations of the components of the device 100 may be coupled together by one or more other suitable techniques.

Example Power Supply Scheme

Figure 2:
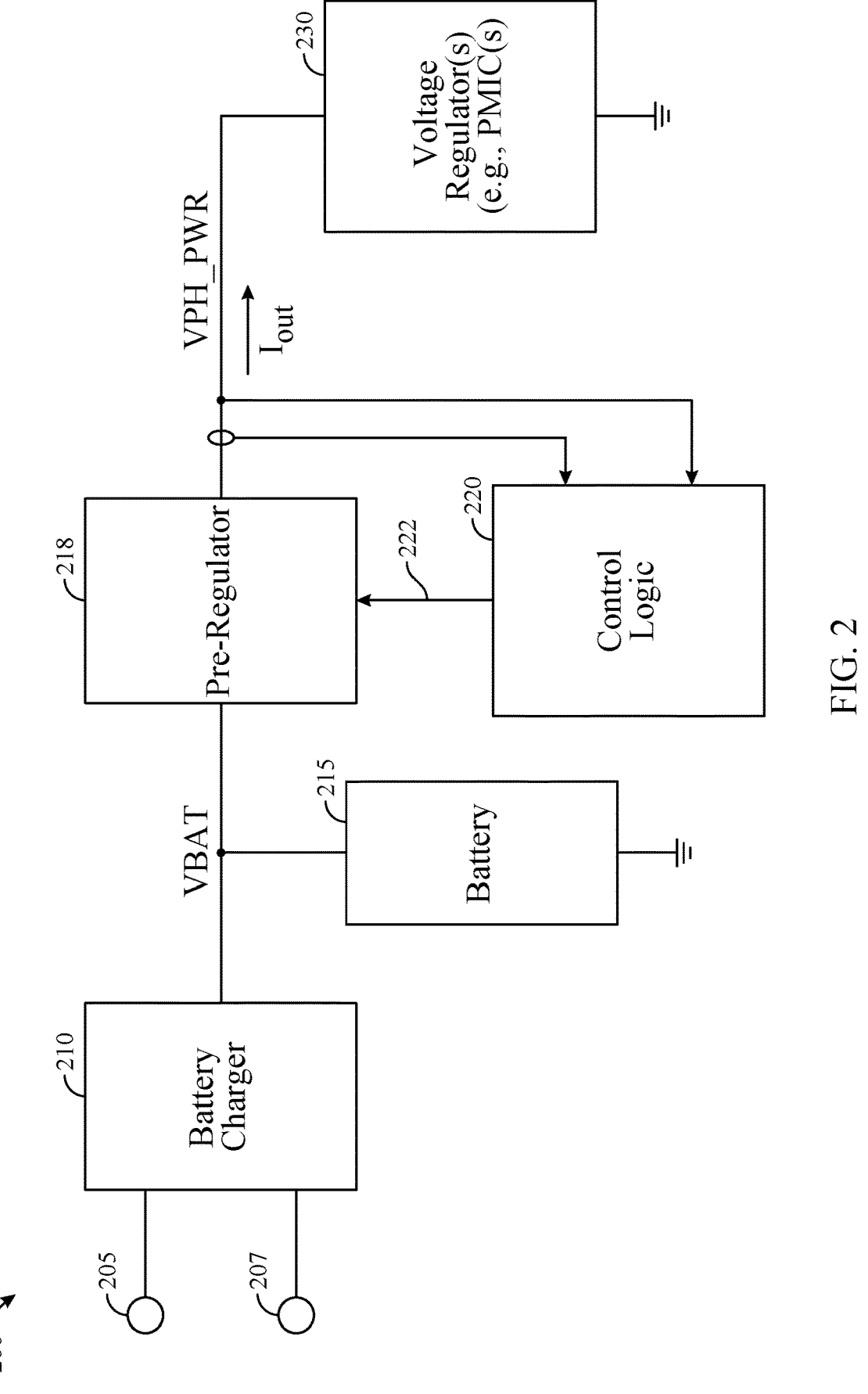
FIG. 2 is a block diagram of an example power supply scheme comprising a battery charging circuit, a battery circuit, and a pre-regulator for regulating power to one or more voltage regulators, in accordance with certain aspects of the present disclosure.

FIG. 2 is a block diagram of an example power supply scheme 200, in accordance with certain aspects of the present disclosure. The power supply scheme 200 includes a battery charging circuit 210, a battery circuit 215, a pre-regulator 218, and one or more voltage regulators 230. Control logic 220 may receive various inputs (e.g., voltage and/or current feedback signals) and may control the pre-regulator 218, the battery charging circuit 210, and/or the voltage regulators 230.

The battery charging circuit 210 may receive power from one or more ports (e.g., ports 205 and 207), and this received power may be converted and used to charge a battery or a battery pack in a battery circuit 215 of a portable device (e.g., a smartphone, tablet, and the like). For example, port 205 may be a Universal Serial Bus (USB) port for connecting to a wall adapter, whereas port 207 may be a wireless power port. The battery circuit 215 may include a single-cell or multi-cell-in-series battery (e.g., a two-cells-in-series, or 2S, battery). The battery circuit 215 may also include any protection circuitry, which may include switches implemented by transistors, for example. For certain aspects, the battery charging circuit 210, or at least a portion thereof, may reside in a PMIC in the device. The battery charging circuit 210 may comprise, for example, one or more switched-mode power supplies (e.g., a buck converter and/or a charge pump converter). For certain aspects, the battery charging circuit may comprise two or more parallel charging circuits, each capable of charging the battery, which may be connected together and to the battery in an effort to provide fast charging of the battery. The parallel charging circuits may be configured so that these circuits do not adversely interfere with each other during battery charging (e.g., in a master-slave relationship). Charging circuits for a parallel charger may use buck converter topologies, such as a three-level buck converter topology. However, one or more of the buck converters may be replaced with a charge pump converter in some parallel charging circuits.

The pre-regulator 218 may receive power from the battery with a voltage VBAT (e.g., 7 to 9 V). Used to regulate power for the voltage regulators 230, the pre-regulator 218 may comprise, for example, one or more switched-mode power supplies (e.g., a buck converter, a charge pump converter, or an adaptive combination power supply circuit capable of switching therebetween). As described below, the control logic 220 may receive an indication of a current associated with the pre-regulator 218 (e.g., output current Iout) and an indication of the output voltage VPH_PWR (e.g., 3.3 to 4 V) from the pre-regulator. Based, at least in part, on these indications, the control logic 220 may output one or more control signals 222 to control the pre-regulator 218. For example, in the case of a three-level buck converter topology, the control logic 220 may output signals as inputs to the gate drivers for driving the power transistors to regulate the output voltage VPH_PWR. The one or more voltage regulators 230 may include one or more linear regulators and/or one or more switching regulators for generating smaller voltages (e.g., 1.2 to 3.3 V) from VPH_PWR. For certain aspects, the voltage regulators 230 may include core PMICs for the device.

Example Power Supply Circuit and Operation

As described above, a pre-regulator (e.g., the pre-regulator 218) may be implemented by a switched-mode power supply (e.g., a buck converter, a charge pump converter, or an adaptive combination power supply circuit capable of switching therebetween), which may be a single-phase or multi-phase converter. For certain aspects, a three-level buck converter may be utilized to implement a pre-regulator.

Figure 3:
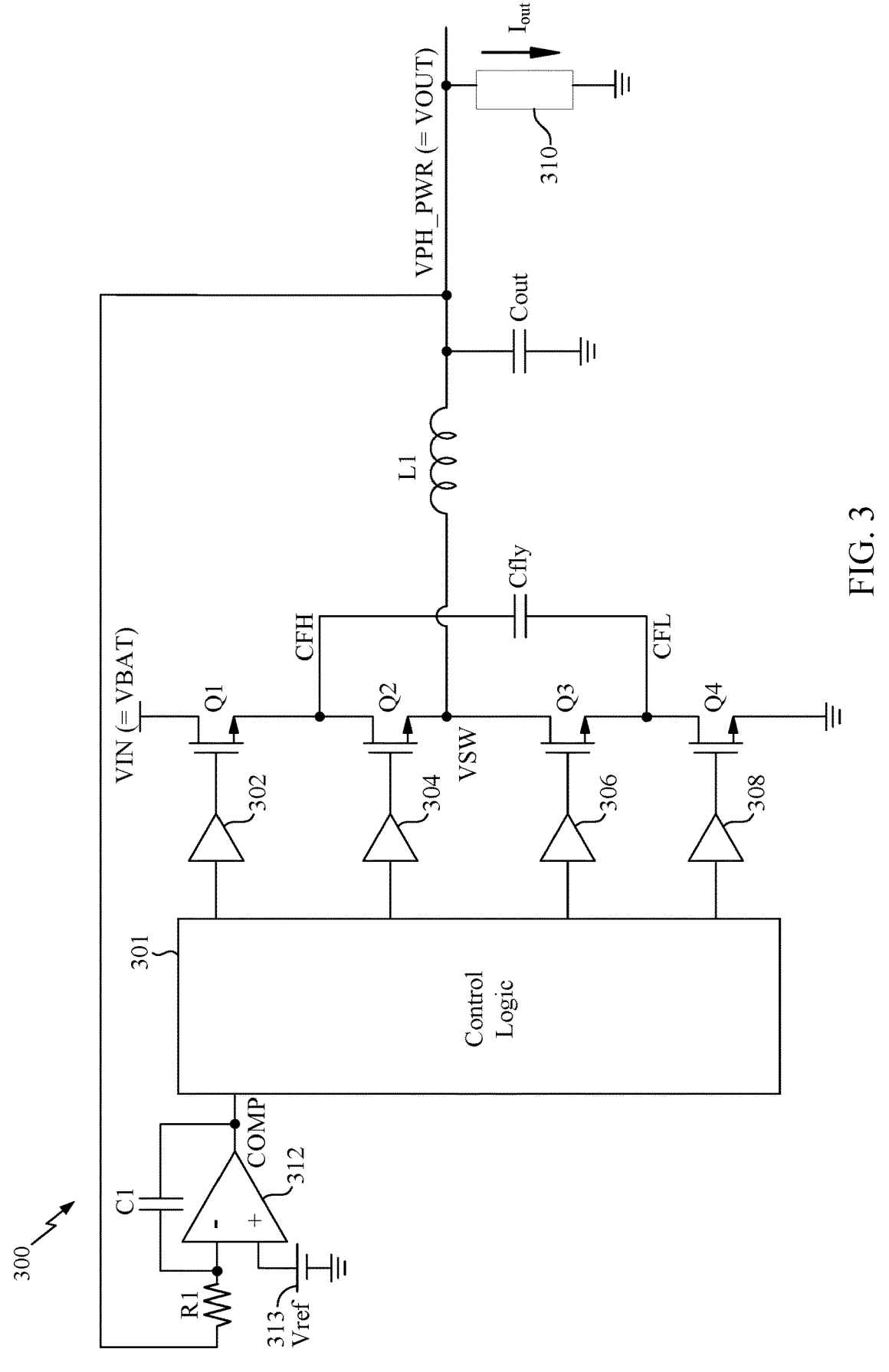
FIG. 3 is a circuit diagram of an example power supply circuit with a three-level buck converter, in accordance with certain aspects of the present disclosure.

A single-phase three-level buck converter topology (as illustrated in the power supply circuit 300 of FIG. 3) may include four switches (implemented by a first transistor Q1, a second transistor Q2, a third transistor Q3, and a fourth transistor Q4), a flying capacitive element Cfly, an inductive element L1, and one or more shunt capacitive elements (represented here by capacitor Cout). An output node (labeled "VPH_PWR" or "VOUT") of the power supply circuit 300 may be coupled to a shunt load 310. Output current $I_{out}$ of the power supply circuit 300 may pass through the shunt load 310, as is shown in FIG. 3.

Transistor Q2 may be coupled to transistor Q1 via a first node (labeled "CFH" for flying capacitor high node), transistor Q3 may be coupled to transistor Q2 via a second node (labeled "VSW" for voltage switching node), and transistor Q4 may be coupled to transistor Q3 via a third node (labeled "CFL" for flying capacitor low node). For certain aspects, the transistors Q1-Q4 may be implemented as n-type metal-oxide-semiconductor (NMOS) transistors, as illustrated in FIG. 3. In this case, the drain of transistor Q2 may be coupled to the source of transistor Q1, the drain of transistor Q3 may be coupled to the source of transistor Q2, and the drain of transistor Q4 may be coupled to the source of transistor Q3. The source of transistor Q4 may be coupled to a reference potential node (e.g., electrical ground) for the power supply circuit 300. The flying capacitive element Cfly may have a first terminal coupled to the first node and a second terminal coupled to the third node. The inductive element L1 may have a first terminal coupled to the second node and a second terminal coupled to the output node (labeled "VPH_PWR," but also referred to as "VOUT"), the one or more shunt capacitive elements, and the shunt load 310.

Control logic 301 may control operation of the power supply circuit 300 and may be the same or different from control logic 220 in FIG. 2. For example, control logic 301 may control operation of the transistors Q1-Q4 via output signals to the inputs of respective gate drivers 302, 304, 306, and 308. The outputs of the gate drivers 302, 304, 306, and 308 are coupled to respective gates of transistors Q1-Q4. During operation of the power supply circuit 300, the control logic 301 may cycle through different phases, which may differ depending on whether the duty cycle of the power supply circuit is less than 50% or greater than 50%.

For certain aspects, the power supply circuit 300 may include one or more feedback circuits. The feedback circuits may sense the output voltage $V_{out}$ from the output node and/or the output current $I_{out}$ delivered to the shunt load 310, process the sensed voltage and/or current, and feed the processed signal(s) to the control logic 301. The control logic 301 may control operation of the power supply circuit 300 based on the processed signal(s). The feedback circuits may be implemented by any of various suitable circuits for sensing and processing voltage or current. In the example of FIG. 3, the feedback circuit for sensing the output voltage $V_{out}$ includes an error amplifier 312, a voltage source 313, a resistive element (represented by resistor R1), and a capacitive element (represented by capacitor C1). As shown, the output (labeled "COMP") of the error amplifier 312 is coupled to the negative terminal of the error amplifier 312 via the capacitive element and to the control logic 301. The positive terminal of the error amplifier 312 is coupled to the output node VPH_PWR via the resistive element. The voltage source 313 may be tunable and may generate a reference voltage Vref for the error amplifier 312.

Operation of the power supply circuit 300 with a duty cycle of less than 50% is described first. In a first phase (referred to as a "charge phase"), transistors Q1 and Q3 are activated, and transistors Q2 and Q4 are deactivated, to charge the flying capacitive element Cfly and to energize the inductive element L1. In a second phase (called a "holding phase"), transistor Q1 is deactivated, and transistor Q4 is activated, such that the VSW node is coupled to the reference potential node, the flying capacitive element Cfly is disconnected (e.g., one of the Cfly terminals is floating), and the inductive element L1 is deenergized. In a third phase (referred to as a "discharge phase"), transistors Q2 and Q4 are activated, and transistor Q3 is deactivated, to discharge the flying capacitive element Cfly and to energize the inductive element L1. In a fourth phase (also referred to as a "holding phase"), transistor Q3 is activated, and transistor Q2 is deactivated, such that the flying capacitive element Cfly is disconnected and the inductive element L1 is deenergized.

Operation of the power supply circuit 300 with a duty cycle greater than 50% is similar in the first and third phases, with the same transistor configurations. However, in the second phase (called a "holding phase") following the first phase, transistor Q3 is deactivated, and transistor Q2 is activated, such that the VSW node is coupled to an input voltage node (labeled "VIN," which in some cases may be a battery voltage node "VBAT"), the flying capacitive element Cfly is disconnected, and the inductive element L1 is energized. Similarly in the fourth phase (also referred to as a "holding phase") with a duty cycle greater than 50%, transistor Q1 is activated, and transistor Q4 is deactivated, such that the flying capacitive element Cfly is disconnected and the inductive element L1 is energized.

Example Two-Level Buck Converter Mode with Cfly Balancing

In some scenarios (e.g., light load conditions), a three-level buck converter may be operated in a two-level buck converter mode. For example, during a charge phase of the two-level buck converter mode, transistors Q1, Q2 may be turned on (e.g., biased in an activated state), and transistors Q3, Q4 may be turned off (e.g., biased in a deactivated state). Thus, current may flow from an input node of the converter through channels of transistors Q1, Q2 to the inductive element L1, charging the inductive element. During a discharge phase, the transistors Q1, Q2 may be turned off, and transistors Q3, Q4 may be turned on (e.g., biased in an activated state). Thus, current may flow from a reference potential node of the converter through channels of transistors Q3, Q4 to the inductive element, discharging the inductive element.

Figure 4A:
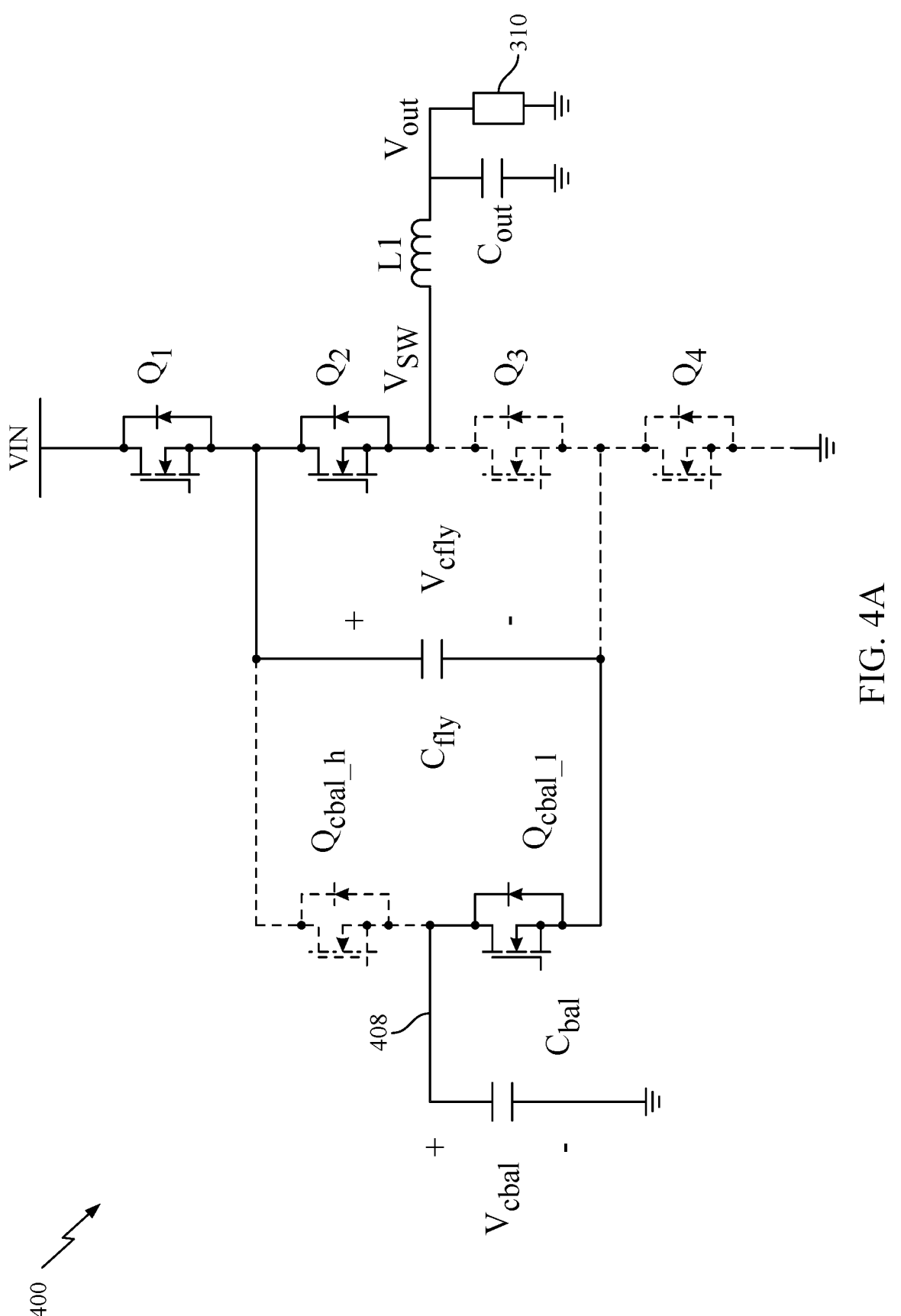
FIG. 4A is a schematic diagram of an example three-level buck converter circuit with a balancing capacitor circuit operated during a first phase of a two-level buck converter mode, in accordance with certain aspects of the present disclosure.
Figure 4B:
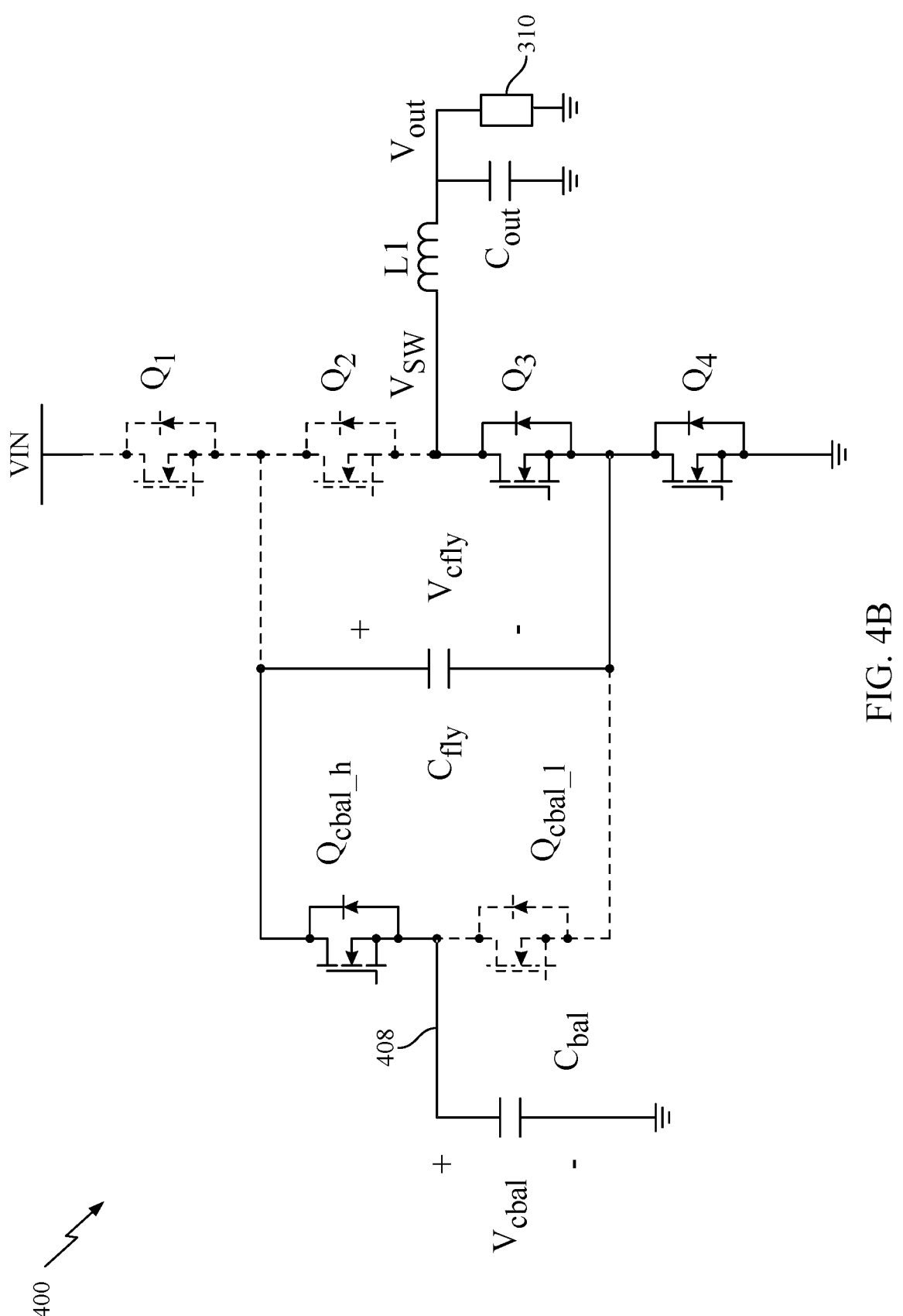
FIG. 4B is a schematic diagram of an example three-level buck converter circuit with a balancing capacitor circuit operated during a second phase of a two-level buck converter mode, in accordance with certain aspects of the present disclosure.

For certain aspects, the three-level buck converter may include a voltage control circuit 400 for controlling the voltage $V_{cfly}$ across the flying capacitor Cfly during operation of the buck converter (e.g., control the voltage $V_{cfly}$ to a defined voltage of Vin/2 (half the input voltage)), as illustrated in FIGS. 4A and 4B. Vin is the voltage at the input node of the three-level buck converter. The voltage control circuit 400 may include upper and lower balancing switching devices (e.g., transistors Qcbal_h and Qcbal_l, respectively) coupled in series, the series combination being coupled in parallel with the flying capacitor Cfly. Similar to the power switching devices (transistors Q1, Q2, Q3, and Q4) in the buck converter, each of the balancing switching devices (Qcbal_h and Qcbal_l) may be configured as a transistor, such as a field-effect transistor (FET), a derivative thereof (e.g., NMOS FET, PMOS FET, pass gate, transmission gate, etc.), or a bipolar junction transistor (BJT). The set of balancing switching devices (Qcbal_h and Qcbal_l) includes a set of control inputs (e.g., gates) configured to receive a set of control signals. Similar to the control signals for the switching devices (transistors Q1, Q2, Q3, and Q4) in the buck converter, the set of control signals in the voltage control circuit controls the closed (on) and open (off) states of the set of balancing switching devices (Qcbal_h and Qcbal_l). In this example, the control signal being a logic high voltage closes the corresponding switching device, and being a logic low voltage opens the corresponding switching device. This may be the same as or different from the power switching devices (transistors Q1, Q2, Q3, and Q4) of the three-level buck converter.

The voltage control circuit 400 further includes a balancing capacitor Cbal coupled between a node 408 between the balancing switching devices (Qcbal_h and Qcbal_l) and the reference potential node (e.g., electrical ground). That is, a first terminal of the balancing capacitor Cbal is coupled to node 408, and a second terminal of the balancing capacitor Cbal is coupled to the reference potential node. The balancing capacitor Cbal may be configured to have substantially the same capacitance as the flying capacitor Cfly. This is done so that the voltage $V_{cfly}$ across the flying capacitor Cfly is substantially the same as the voltage $V_{cbal}$ across the balancing capacitor Cbal (e.g., at substantially Vin/2), when these capacitors are coupled in series between the power supply rail (Vin) and the reference potential node (e.g., when transistors Q1 and Qcbal_l are turned on).

In three-level buck converter mode operation, transistor Qcbal_l may be closed (and transistor Qcbal_h may be open) during flying capacitor Cfly charging when transistors Q1 and Q3 are closed (and transistors Q2 and Q4 are open). In addition, transistor Qcbal_h may be closed (and transistor Qcbal_l may be open) during flying capacitor Cfly discharging when transistors Q2 and Q4 are closed (and transistors Q1 and Q3 are open). As described above, the three-level buck converter may be operated in a two-level buck converter mode to increase efficiency during light load conditions. It may be desirable to balance the voltage across flying capacitor Cfly (e.g., to Vin/2) during operation in the two-level buck converter mode, as well. Without such balancing, the inductor current (IL) may exhibit an uneven peak when transitioning from the two-level to the three-level buck converter mode, which may take a relatively long time (e.g., 100 μs) to settle until the flying capacitor Cfly is eventually rebalanced.

In a first phase of the two-level buck converter mode (also referred to as a "charge phase"), the three-level buck converter is in powering mode, and the switching node VSW is pulled up to the power supply rail voltage (e.g., to the input voltage of the input node VIN). To achieve this, transistors Q1 and Q2 (as shown in FIG. 3) are concurrently turned on (e.g., the switches are closed), and transistors Q3 and Q4 are concurrently turned off (e.g., the switches are opened). In a second phase of the two-level buck converter mode (e.g., also referred to herein as a "discharge phase"), the switching node VSW is pulled down to the reference potential (e.g., to the electrical ground at 0 V). In this case, transistors Q3 and Q4 are concurrently turned on, and transistors Q1 and Q2 are concurrently turned off. Thus, the three-level buck converter behaves as a two-level buck converter when the two-level buck converter mode is enabled.

FIG. 4A is a schematic diagram of an example three-level buck converter circuit with the voltage control circuit 400 operated during the first phase of the two-level buck converter mode, in accordance with certain aspects of the present disclosure. In the first phase, transistors Q1, Q2, and Qcbal_l are turned on, while transistors Q3, Q4, and Qcbal_h are turned off, as shown. In this manner, the flying capacitor Cfly is effectively connected in series with the balancing capacitor Cbal during the first phase.

FIG. 4B is a schematic diagram of an example three-level buck converter circuit with the voltage control circuit 400 operated during the second phase of the two-level buck converter mode, in accordance with certain aspects of the present disclosure. In the second phase, transistors Q3, Q4, and Qcbal_h are turned on, while transistors Q1. Q2, and Qcbal_l are turned off, as shown. In this manner, the flying capacitor Cfly is effectively connected in parallel with the balancing capacitor Cbal during the second phase.

To implement this capacitor balancing in the three-level and two-level buck converter modes, the control logic may control the gate driver of transistor Qcbal_l such that: (1) in the two-level buck converter mode, transistor Qcbal_l is turned on if transistors Q1 and Q2 are turned on, and (2) in the three-level buck converter mode, transistor Qcbal_l is turned on if transistors Q1 and Q3 are turned on. Otherwise, transistor Qcbal_l may be turned off. The control logic may also control the gate driver of transistor Qcbal_h such that: (1) in the two-level buck converter mode, transistor Qcbal_h is turned on if transistors Q3 and Q4 are turned on, and (2) in the three-level buck converter mode, transistor Qcbal_h is turned on if transistors Q2 and Q4 are turned on. Otherwise, transistor Qcbal_h may be turned off.

Figure 5:
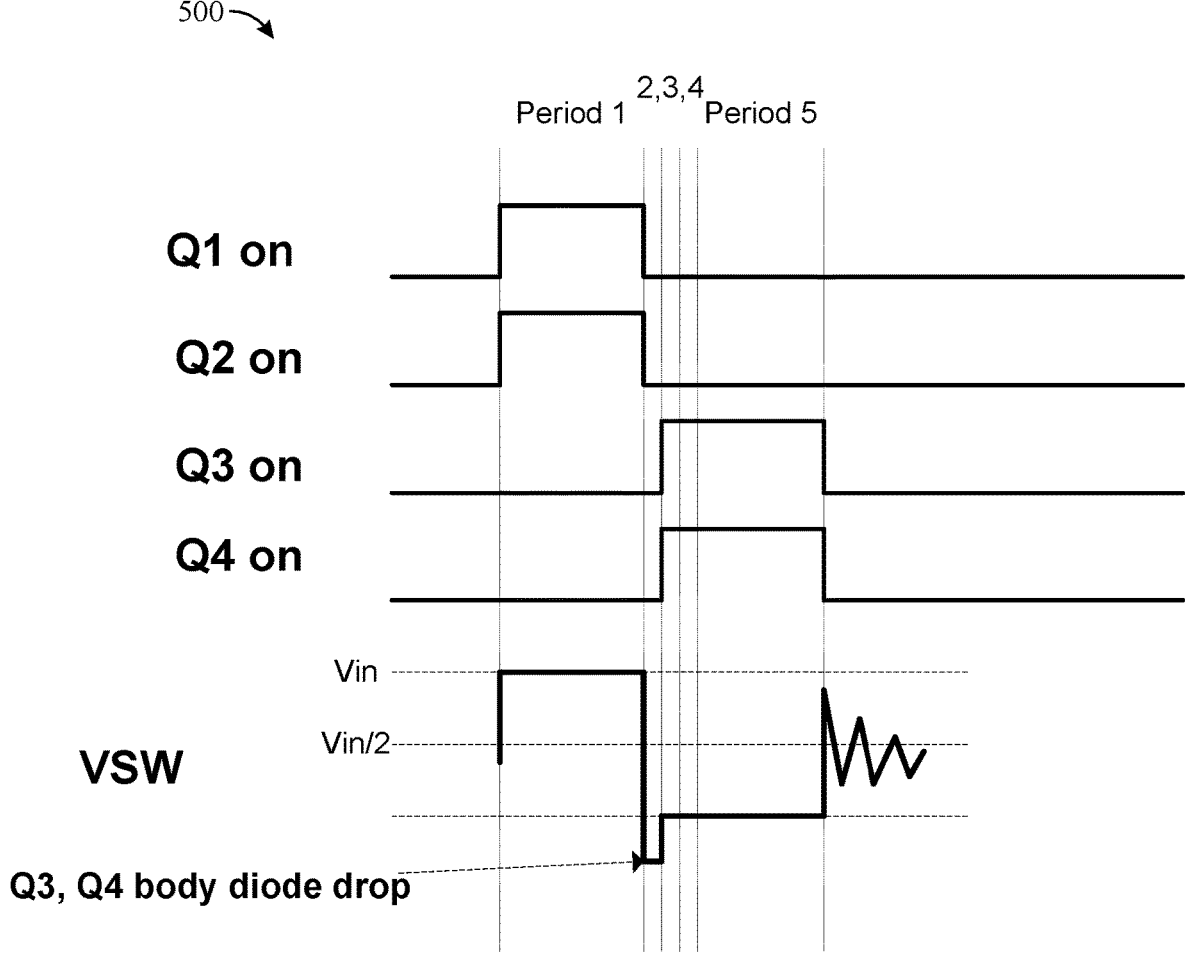
FIG. 5 is an example timing diagram showing control signals and node voltages of an example three-level buck converter circuit operating as a two-level buck converter during a transition between a charge phase and a discharge phase, in accordance with certain aspects of the present disclosure.

Example Switching Configuration for Transitioning Between Charge and Discharge Phases FIG. 5 is a timing diagram 500 illustrating example transistor control signals and node voltages of a three-level buck converter operating in a two-level buck converter mode. As shown, during period 1, a logic high control signal may be provided to turn on transistors Q1 and Q2 (and logic low control signals may leave transistors Q3 and Q4 turned off), coupling inductive element L1 between the input voltage node (VIN) and the output node (VOUT). During periods 3, 4, and 5 (which can be considered as the same period in this scenario), logic high control signals are provided to turn on transistors Q3 and Q4, coupling inductive element L1 between the reference potential node (e.g., electrical ground) and the output node.

As shown, during period 2, transistors Q1, Q2, Q3, and Q4 are turned off, and thus, this period may be referred to as a "dead time." Period 2 may last, for example, 10 nanoseconds (ns) in some implementations. That is, transistors Q1 and Q2 may practically be considered as turning off concurrently when transitioning from period 1 to period 2. During period 2, the body diodes of transistors Q3 and Q4 conduct current. The voltage at the switching node (VSW) drops to a negative voltage corresponding to the sum of the forward voltages of the body diodes of transistors Q3 and Q4. For example, given an individual body diode forward voltage of 0.6 V, the voltage at the switching node may drop to −1.2 V. Moreover, parasitic negative-positive-negative (NPN) gain created by minority carrier injection may be increased (e.g., by five times). The power efficiency of the buck converter circuit may be degraded (e.g., by 1 to 2 percent). Moreover, the negative voltage at the switching node may cause reliability issues (e.g., may create a latch-up issue).

Certain aspects of the present disclosure are directed to a switching scheme that reduces the voltage drop at the switching node when transitioning from transistors Q1 and Q2 being turned on (e.g., during a charge phase) to transistors Q3 and Q4 being turned on (e.g., during a discharge phase), or vice versa. This switching scheme may involve a multi-step transition with delays between turning off transistors that were previously turned on. For example, transistor Q2 (or Q1) is turned off after transistor Q1 (or Q2) is turned off (and after transistor Q4 (or Q3) is turned on).

Figure 6A:
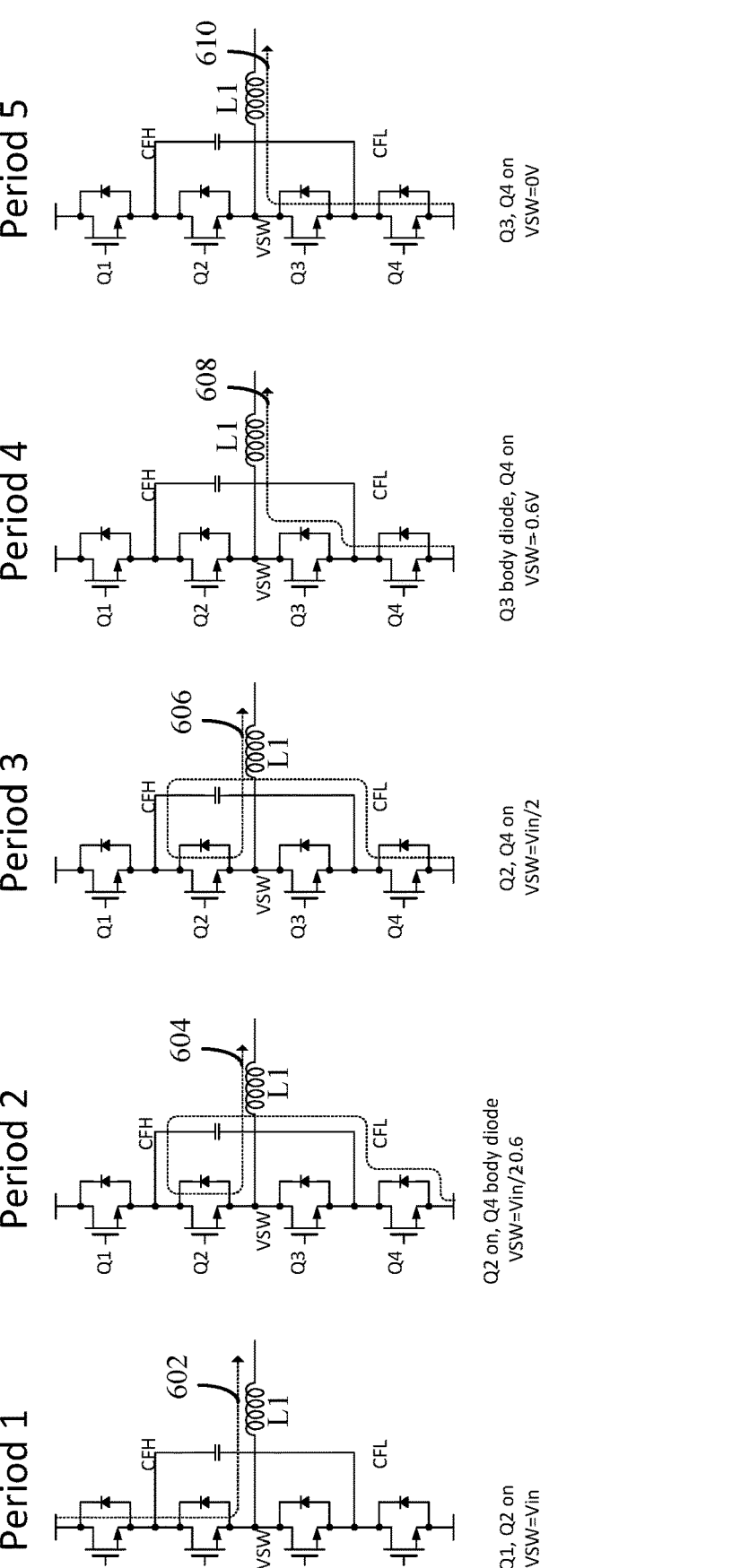
FIG. 6A is a schematic diagram illustrating current flow in an example three-level buck converter circuit operating as a two-level buck converter during periods between a charge phase and a discharge phase using a first switching pattern, in accordance with certain aspects of the present disclosure.
Figure 6B:
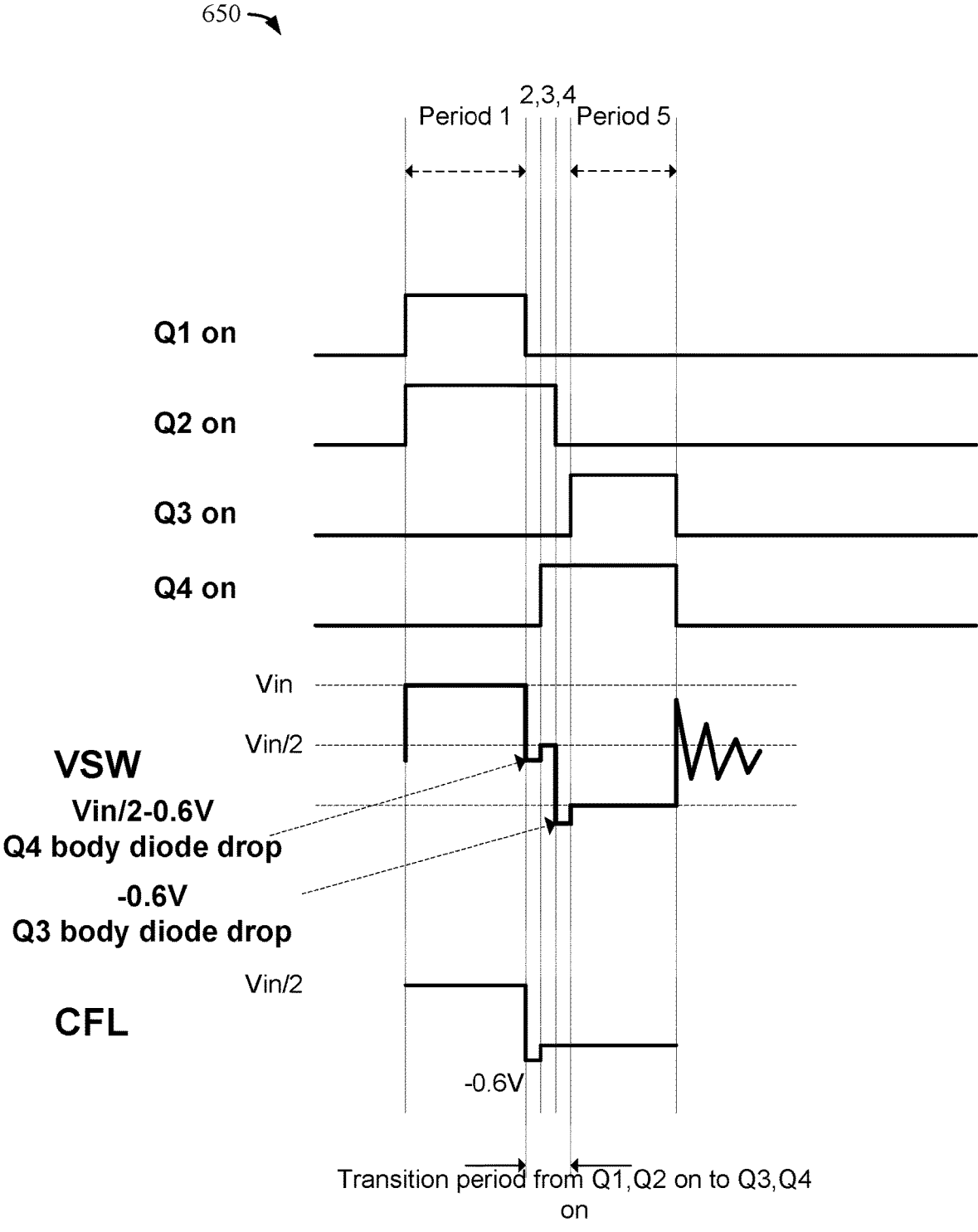
FIG. 6B is an example timing diagram showing control signals and node voltages of the example three-level buck converter circuit during periods between the charge phase and the discharge phase using the first switching pattern of FIG. 6A, in accordance with certain aspects of the present disclosure.

FIG. 6A illustrates current flow in a three-level buck converter operating in a two-level buck converter mode during different periods, in accordance with certain aspects of the present disclosure. FIG. 6B is a timing diagram 650 illustrating example transistor control signaling and node voltages associated with the different periods of operation shown in FIG. 6A.

As shown, during period 1 (e.g., corresponding to a charge phase of the three-level buck converter), transistors Q1, Q2 are turned on, transistors Q3, Q4 are turned off, and current 602 flows across channels of transistors Q1, Q2 and the inductive element L1 from the input node (VIN) to the output node (VOUT). To transition from the charge phase during period 1 to a discharge phase during period 5, a switching pattern may occur during periods 2-4 to reduce the voltage drop at the switching node. As shown, during period 1, the switching node voltage may be equal to Vin (e.g., the voltage at the input node). Moreover, the voltage at the flying capacitor low node (CFL) may be equal to Vin/2.

As shown, during period 2, transistor Q1 may be turned off while transistor Q2 remains on. Thus, as shown in FIG. 6A, current 604 may flow from the reference potential node, across the body diode of transistor Q4, across Cfly, across a channel of transistor Q2, and across the inductive element L1 to the output node. As shown in FIG. 6B, the switching node voltage drops to Vin/2 minus the forward voltage of the diode of transistor Q4 (e.g., Vin/2−0.6 V). Moreover, the voltage at the CFL node may be equal to zero volts minus the forward voltage of the diode of transistor Q4 (e.g., −0.6 V).

During period 3, transistor Q4 is turned on, allowing current 606 to flow across a channel of transistor Q4, rather than through the body diode. Thus, the switching node voltage may be equal to Vin/2, and the voltage at the CFL node may be equal to zero volts (e.g., since the CFL node is electrically coupled to electric ground via activated transistor Q4).

During period 4, the transistor Q2 may be turned off. Therefore, the current 608 may flow from the reference potential node across a channel of transistor Q4, across the body diode of transistor Q3, and across the inductive element L1 to the output node. Therefore, in period 4, the switching node voltage may be equal to zero volts minus the voltage drop across the body diode of transistor Q3 (e.g., −0.6 V), and the voltage at the CFL node may remain at zero volts.

During period 5 (e.g., corresponding to a discharge phase of the three-level buck converter), transistor Q3 may be turned on, and current 610 flows from the reference potential node to the output node through channels of transistors Q3, Q4 and the inductive element L1. As shown, the switching node voltage becomes zero volts.

As shown in FIG. 6B, the lowest voltage at the switching node (VSW) during the transition may be −0.6 V, which is greater than the −1.2 V associated with the switching scheme described with respect to FIG. 5. Therefore, power supply efficiency is increased with the switching scheme described with respect to FIGS. 6A and 6B. Furthermore, as illustrated in FIG. 6B, the voltage at the switching node (VSW) experienced two major transitions (e.g., a two-step transition), from Vin to Vin/2, and then to zero volts (with minor transitions in between), whereas in the switching scheme described with respect to FIG. 5, the voltage at VSW experienced a single major transition (with a minor transition).

While the example switching configuration is described herein with respect to switching from a charge phase to a discharge phase to facilitate understanding, certain aspects of the present disclosure may be applied to switching from the discharge phase to the charge phase. For example, to switch from the discharge phase (e.g., shown in period 5 of FIG. 6A), transistor Q3 may be turned off (e.g., as shown in period 4 of FIG. 6A), then transistor Q2 may be turned on (e.g., as shown in period 3 of FIG. 6A), then transistor Q4 may be turned off (e.g., as shown in period 2 of FIG. 6A), and then transistor Q1 may be turned on (e.g., as shown in period 1 of FIG. 6A).

Figure 7A:
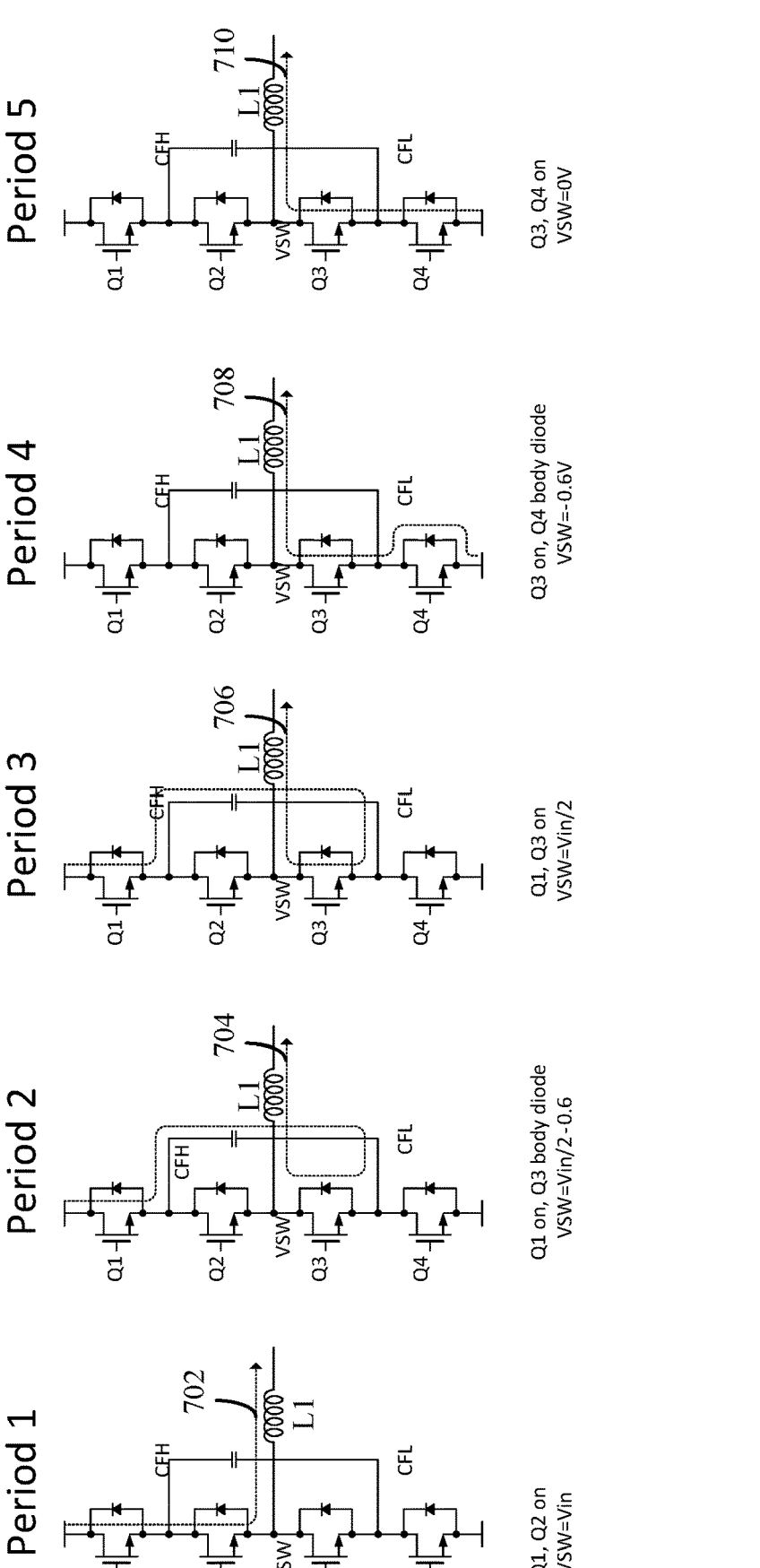
FIG. 7A is a schematic diagram illustrating current flow in an example three-level buck converter circuit operating as a two-level buck converter during periods between a charge phase and a discharge phase using a second switching pattern, in accordance with certain aspects of the present disclosure.
Figure 7B:
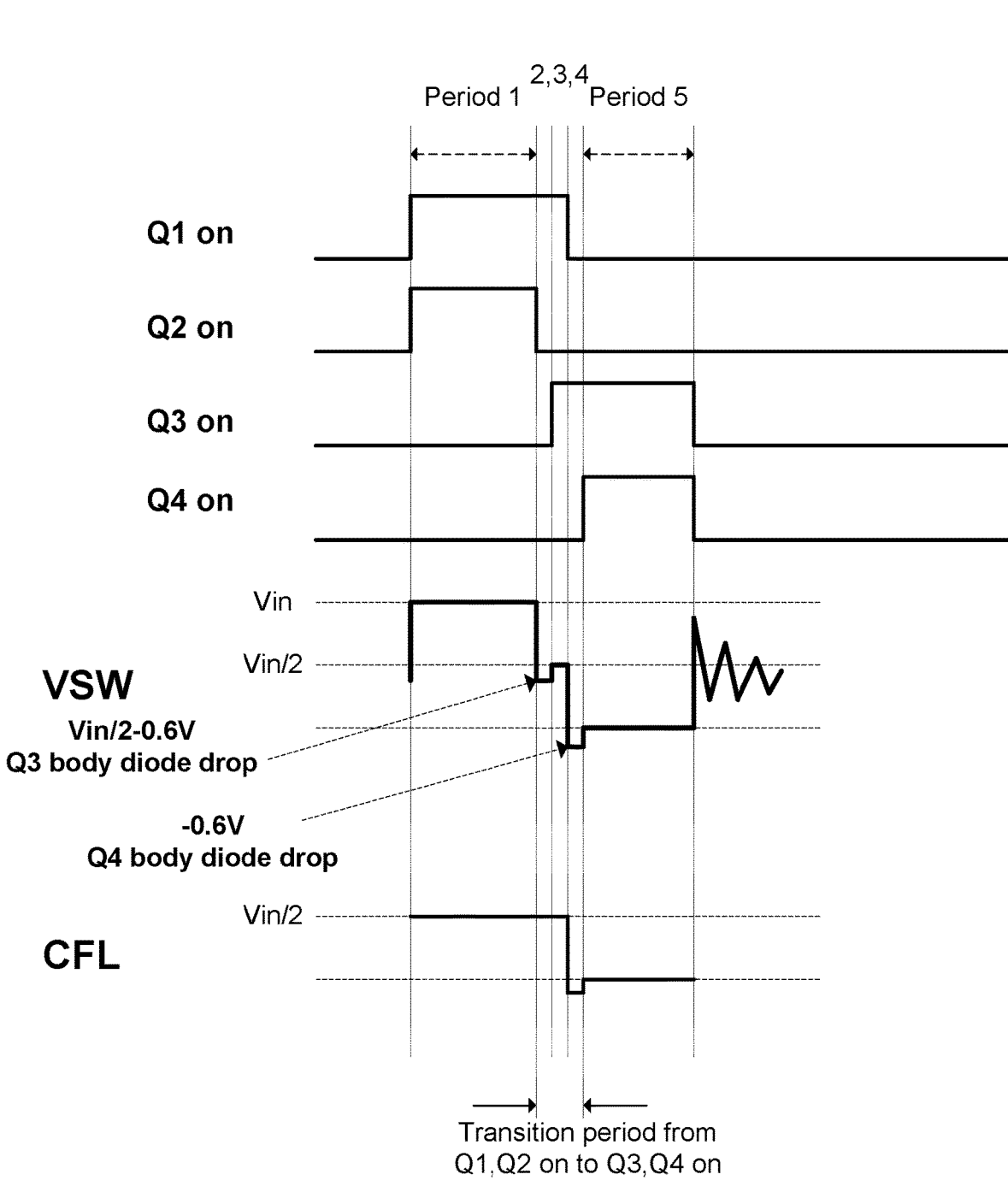
FIG. 7B is an example timing diagram showing control signals and node voltages of the example three-level buck converter circuit during periods between the charge phase and the discharge phase using the second switching pattern of FIG. 7A, in accordance with certain aspects of the present disclosure.

FIG. 7A illustrates current flow in a three-level buck converter operating in a two-level buck converter mode during different periods, in accordance with certain aspects of the present disclosure. FIG. 7B is a timing diagram 750 illustrating example transistor control signaling and node voltages associated with the different periods of operation shown in FIG. 7A.

As shown, during period 1 (charge phase), transistors Q1, Q2 are turned on, transistors Q3, Q4 are turned off, and current 702 flows across channels of transistors Q1, Q2 and the inductive element L1 from the input node to the output node. To transition from the charge phase during period 1 to the discharge phase during period 5, an alternative switching pattern may occur during periods 2-4 to reduce the voltage drop at the switching node. As shown, during period 1, the switching node voltage may be equal to Vin. Moreover, the voltage at the flying capacitor low node (CFL) may be equal to Vin/2.

As shown, during period 2, transistor Q1 may remain turned on while transistor Q2 is turned off. Thus, as shown in FIG. 7A, current 704 may flow from the input voltage node, across the channel of transistor Q1, across Cfly, across the body diode of transistor Q3, and across the inductive element L1 to the output node. As shown in FIG. 7B, the switching node voltage drops to Vin/2 minus the forward voltage of the diode of transistor Q3 (e.g., Vin/2−0.6 V). Moreover, the voltage at the CFL node may remain at Vin/2.

During period 3, transistor Q3 is turned on, allowing current 706 to flow across a channel of transistor Q3, rather than through the body diode. Thus, the switching node voltage may be equal to Vin/2, and the voltage at the CFL node may remain at Vin/2 (e.g., since the switching node and the CFL node are electrically coupled via activated transistor Q3).

During period 4, the transistor Q1 may be turned off. Therefore, the current 708 may flow from the reference potential node, across the body diode of transistor Q4, across the channel of transistor Q3, and across the inductive element L1 to the output node. Therefore, in period 4, the switching node voltage may be equal to zero volts minus the forward voltage of the body diode of transistor Q4 (e.g., −0.6 V). The voltage at the CFL node may also be equal to zero volts minus the forward voltage of the body of transistor Q4.

During period 5 (discharge phase), transistor Q4 may be turned on, and current 710 flows from the reference potential node to the output node through channels of transistors Q3, Q4 and the inductive element L1. As shown, the switching node voltage and the voltage at the CFL node become zero volts.

As shown in FIG. 7B, the lowest voltage at the switching node during the transition may be −0.6 V, which is greater than the −1.2 V associated with the switching scheme described with respect to FIG. 5. Therefore, power supply efficiency is increased with the switching scheme described with respect to FIGS. 7A and 7B. Furthermore, as illustrated in FIG. 7B, the voltage at the switching node (VSW) experienced two major transitions (e.g., a two-step transition), from Vin to Vin/2, and then to zero volts (with minor transitions in between), whereas in the switching scheme described with respect to FIG. 5, the voltage at VSW experienced a single major transition (with a minor transition).

While the example switching configuration described herein is described with respect to switching from a charge phase to a discharge phase to facilitate understanding, certain aspects of the present disclosure may be applied to switching from the discharge phase to the charge phase. For example, to switch from the discharge phase (e.g., shown in period 5 of FIG. 7A), transistor Q4 may be turned off (e.g., as shown in period 4 of FIG. 7A), then transistor Q1 may be turned on (e.g., as shown in period 3 of FIG. 7A), then transistor Q3 may be turned off (e.g., as shown in period 2 of FIG. 7A), and then transistor Q2 may be turned on (e.g., as shown in period 1 of FIG. 7A).

FIG. 8 is a flow diagram illustrating example operations 800 for supplying power. The operations 800 may be performed by power supply circuit (e.g., the power supply circuit of FIG. 3) having a three-level buck converter and logic (e.g., the control logic 301) configured to control the switching scheme in the three-level buck converter.

At block 802, the controller may bias a first transistor and a second transistor in activated states during a charge phase of the power supply circuit. The first transistor and the second transistor may be coupled between an input node of the power supply circuit and a switching node of the power supply circuit, the switching node being coupled to an inductive element.

At block 804, the controller switches activation states of the first transistor and the second transistor during different periods between the charge phase and a discharge phase. At block 806, the controller biases a third transistor and a fourth transistor in activated states during a discharge phase of the power supply circuit. The third transistor and the fourth transistor may be coupled between a reference potential node of the power supply circuit and the switching node of the power supply circuit.

In some aspects, the charge phase occurs during a first period (e.g., period 1 described with respect to FIG. 6A or FIG. 7A). Switching the activation state may include biasing the first transistor in a deactivated state during a second period (e.g., period 2) after the first period, biasing the fourth transistor in an activated state during a third period (e.g., period 3) after the second period, and biasing the second transistor in an activated state during a fourth period (e.g., period 4) after the third period. The discharge phase may occur in a fifth period (e.g., period 5) after the fourth period.

In some aspects, the first transistor (e.g., transistor Q1 of FIG. 6A) is coupled between the input node and a first node. The second transistor (e.g., transistor Q2 of FIG. 6A) may be coupled between the first node and the switching node. The third transistor (e.g., transistor Q3 of FIG. 6A) may be coupled between the switching node and a second node. The fourth transistor (e.g., transistor Q4 of FIG. 6A) may be coupled between the second node and the reference potential node. The power supply circuit may include a flying capacitor having a first terminal coupled to the first node and a second terminal coupled to the second node. During the second period (e.g., period 2 of FIG. 6A), current flows from the reference potential node, across a body diode of the fourth transistor, across the flying capacitor, across a channel of the second transistor, and to the inductive element. During the third period (e.g., period 3 of FIG. 6A), current flows from the reference potential node, across a channel of the fourth transistor, across the flying capacitor, across a channel of the second transistor, and to the inductive element. During the fourth period (e.g., period 4 of FIG. 6A), current flows from the reference potential node, across a channel of the fourth transistor, across a body diode of the third transistor, and to the inductive element.

In some aspects, the second transistor (e.g., transistor Q1 of FIG. 7A) may be coupled between the input node and a first node. The first transistor (e.g., transistor Q2 of FIG. 7A) may be coupled between the first node and the switching node. The fourth transistor (e.g., transistor Q3 of FIG. 7A) is coupled between the switching node and a second node. The third transistor (e.g., transistor Q4 of FIG. 7A) may be coupled between the second node and the reference potential node. The power supply circuit may include a flying capacitor having a first terminal coupled to the first node and a second terminal coupled to the second node. During the second period (e.g., period 2 of FIG. 7A), current flows from the input node, across a channel of the second transistor, across the flying capacitor, across a body diode of the fourth transistor, and to the inductive element. During the third period (e.g., period 3 of FIG. 7A), current flows from the input node, across a channel of the second transistor, across the flying capacitor, across a channel of the fourth transistor, and to the inductive element. During the fourth period (e.g., period 4 of FIG. 7A), current flows from the reference potential node, across a body diode of the third transistor, across a channel of the fourth transistor, and to the inductive element.

In some aspects, switching the activation states includes biasing the first transistor in a deactivated state after biasing the second transistor in a deactivated state, during a transition from the charge phase to the discharge phase. In some aspects, biasing the first transistor in the deactivated state includes biasing the first transistor in a deactivated state after biasing the third transistor in an activated state, but before biasing the fourth transistor in an activated state, during the transition from the charge phase to the discharge phase.

Example Aspects

In addition to the various aspects described above, specific combinations of aspects are within the scope of the disclosure, some of which are detailed below:

Aspect 1. A power supply circuit, comprising: a first transistor and a second transistor coupled between an input node of the power supply circuit and a switching node of the power supply circuit, the switching node being coupled to an inductive element; a third transistor and a fourth transistor coupled between a reference potential node of the power supply circuit and the switching node of the power supply circuit; and logic configured to control activation states of the first transistor, the second transistor, the third transistor, and the fourth transistor, such that: during a charge phase of the power supply circuit, the first transistor and the second transistor are configured to be in activated states, and the third transistor and the fourth transistor are configured to be in deactivated states; during a discharge phase of the power supply circuit, the first transistor and the second transistor are configured to be in deactivated states, and the third transistor and the fourth transistor are configured to be in activated states; and the activation states of the first transistor and the second transistor are configured to be switched at different times between the charge phase and the discharge phase.

Aspect 2. The power supply circuit of aspect 1, wherein the logic is configured to control the activation states such that: the charge phase is configured to occur during a first period; during a second period after the first period, the first transistor is configured to be in a deactivated state; during a third period after the second period, the fourth transistor is configured to be in an activated state; during a fourth period after the third period, the second transistor is configured to be in a deactivated state; and the discharge phase configured to occur in a fifth period after the fourth period.

Aspect 3. The power supply circuit of aspect 2, wherein: the first transistor is coupled between the input node and a first node; the second transistor is coupled between the first node and the switching node; the third transistor is coupled between the switching node and a second node; and the fourth transistor is coupled between the second node and the reference potential node.

Aspect 4. The power supply circuit of aspect 3, further comprising a flying capacitor having a first terminal coupled to the first node and a second terminal coupled to the second node, wherein the logic is configured to control the activation states such that: during the second period, current is configured to flow from the reference potential node, across a body diode of the fourth transistor, across the flying capacitor, and across a channel of the second transistor, to the inductive element; during the third period, current is configured to flow from the reference potential node, across a channel of the fourth transistor, across the flying capacitor, and across the channel of the second transistor, to the inductive element; and during the fourth period, current is configured to flow from the reference potential node, across the channel of the fourth transistor and across a body diode of the third transistor, to the inductive element.

Aspect 5. The power supply circuit of any one of aspects 2-4, wherein: the second transistor is coupled between the input node and a first node; the first transistor is coupled between the first node and the switching node; the fourth transistor is coupled between the switching node and a second node; and the third transistor is coupled between the second node and the reference potential node.

Aspect 6. The power supply circuit of aspect 5, further comprising a flying capacitor having a first terminal coupled to the first node and a second terminal coupled to the second node, wherein the logic is configured to control the activation states such that: during the second period, current is configured to flow from the input node, across a channel of the second transistor, across the flying capacitor, and across a body diode of the fourth transistor, to the inductive element; during the third period, current is configured to flow from the input node, across the channel of the second transistor, across the flying capacitor, and across a channel of the fourth transistor, to the inductive element; and during the fourth period, current is configured to flow from the reference potential node, across a body diode of the third transistor and across a channel of the fourth transistor, to the inductive element.

Aspect 7. The power supply circuit of any one of aspects 1-6, further comprising a flying capacitor having: a first terminal coupled to a first node between the first transistor and the second transistor; and a second terminal coupled to a second node between the third transistor and the fourth transistor.

Aspect 8. The power supply circuit of any one of aspects 1-7, wherein the power supply circuit comprises a three-level buck converter configured to operate in a two-level buck converter mode.

Aspect 9. The power supply circuit of any one of aspects 1-8, wherein the logic is configured to control the activation states such that during a transition from the charge phase to the discharge phase, the second transistor is configured to be deactivated after the first transistor is deactivated.

Aspect 10. The power supply circuit of aspect 9, wherein the logic is configured to control the activation states such that during the transition from the charge phase to the discharge phase, the second transistor is configured to be deactivated after the fourth transistor is activated, but before the third transistor is activated.

Aspect 11. A method for operating a power supply circuit, comprising: biasing a first transistor and a second transistor in activated states during a charge phase of the power supply circuit, the first transistor and the second transistor being coupled between an input node of the power supply circuit and a switching node of the power supply circuit, the switching node being coupled to an inductive element; switching activation states of the first transistor and the second transistor at different times between the charge phase and a discharge phase; and biasing a third transistor and a fourth transistor in activated states during the discharge phase of the power supply circuit, the third transistor and the fourth transistor being coupled between a reference potential node of the power supply circuit and the switching node of the power supply circuit.

Aspect 12. The method of aspect 11, wherein: the charge phase occurs during a first period; switching the activation states includes: biasing the first transistor in a deactivated state during a second period after the first period; biasing the fourth transistor in an activated state during a third period after the second period; and biasing the second transistor in a deactivated state during a fourth period after the third period; and the discharge phase occurs in a fifth period after the fourth period.

Aspect 13. The method of aspect 12, wherein: the first transistor is coupled between the input node and a first node; the second transistor is coupled between the first node and the switching node; the third transistor is coupled between the switching node and a second node; and the fourth transistor is coupled between the second node and the reference potential node.

Aspect 14. The method of aspect 13, wherein the power supply circuit further comprises a flying capacitor having a first terminal coupled to the first node and a second terminal coupled to the second node, wherein: during the second period, current flows from the reference potential node, across a body diode of the fourth transistor, across the flying capacitor, and across a channel of the second transistor, to the inductive element; during the third period, current flows from the reference potential node, across a channel of the fourth transistor, across the flying capacitor, and across the channel of the second transistor, to the inductive element; and during the fourth period, current flows from the reference potential node, across the channel of the fourth transistor and across a body diode of the third transistor, to the inductive element.

Aspect 15. The method of any one of aspects 12-14, wherein: the second transistor is coupled between the input node and a first node; the first transistor is coupled between the first node and the switching node; the fourth transistor is coupled between the switching node and a second node; and the third transistor is coupled between the second node and the reference potential node.

Aspect 16. The method of aspect 15, wherein the power supply circuit further comprises a flying capacitor having a first terminal coupled to the first node and a second terminal coupled to the second node, wherein: during the second period, current flows from the input node, across a channel of the second transistor, across the flying capacitor, and across a body diode of the fourth transistor, to the inductive element; during the third period, current flows from the input node, across the channel of the second transistor, across the flying capacitor, and across a channel of the fourth transistor, to the inductive element; and during the fourth period, current flows from the reference potential node, across a body diode of the third transistor and across the channel of the fourth transistor, to the inductive element.

Aspect 17. The method of any one of aspects 11-16, wherein the power supply circuit further comprises a flying capacitor having: a first terminal coupled to a first node between the first transistor and the second transistor; and a second terminal coupled to a second node between the third transistor and the fourth transistor.

Aspect 18. The method of any one of aspects 11-17, wherein the power supply circuit comprises a three-level buck converter operating in a two-level buck converter mode.

Aspect 19. The method of any one of aspects 11-18, wherein switching the activation states comprises biasing the first transistor in a deactivated state after biasing the second transistor in a deactivated state, during a transition from the charge phase to the discharge phase.

Aspect 20. The method of aspect 19, wherein biasing the first transistor in the deactivated state comprises biasing the first transistor in a deactivated state after biasing the third transistor in an activated state, but before biasing the fourth transistor in an activated state, during the transition from the charge phase to the discharge phase.

Aspect 21. An apparatus for operating a power supply circuit, comprising: means for biasing a first transistor and a second transistor in activated states during a charge phase of the power supply circuit, the first transistor and the second transistor being coupled between an input node of the power supply circuit and a switching node of the power supply circuit; means for switching activation states of the first transistor and the second transistor at different times between the charge phase and a discharge phase; and means for biasing a third transistor and a fourth transistor in activated states during a discharge phase of the power supply circuit, the third transistor and the fourth transistor being coupled between a reference potential node of the power supply circuit and the switching node of the power supply circuit.

Aspect 22. The apparatus of aspect 21, wherein: the charge phase occurs during a first period; means for switching the activation state includes: means for biasing the first transistor in a deactivated state during a second period after the first period; means for biasing the fourth transistor in an activated state during a third period after the second period; and means for biasing the second transistor in a deactivated state during a fourth period after the third period; and the discharge phase occurs in a fifth period after the fourth period.

Aspect 23. The apparatus of aspect 22, wherein: the first transistor is coupled between the input node and a first node; the second transistor is coupled between the first node and the switching node; the third transistor is coupled between the switching node and a second node; and the fourth transistor is coupled between the second node and the reference potential node.

Aspect 24. The apparatus of any one of aspects 22-23, wherein: the second transistor is coupled between the input node and a first node; the first transistor is coupled between the first node and the switching node; the fourth transistor is coupled between the switching node and a second node; and the third transistor is coupled between the second node and the reference potential node.

ADDITIONAL CONSIDERATIONS

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In some aspects, means for switching and means for biasing may include a controller, such as the control logic 301, and/or gate drivers, such as gate drivers 302, 304, 306, 308.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. A power supply circuit, comprising:
   a first transistor and a second transistor coupled between an input node of the power supply circuit and a switching node of the power supply circuit, the switching node being coupled to an inductive element;
   a third transistor and a fourth transistor coupled between a reference potential node of the power supply circuit and the switching node of the power supply circuit; and logic configured to control activation states of the first transistor, the second transistor, the third transistor, and the fourth transistor, such that:

during a charge phase of the power supply circuit, the first transistor and the second transistor are configured to be in activated states, and the third transistor and the fourth transistor are configured to be in deactivated states;

during a discharge phase of the power supply circuit, the first transistor and the second transistor are configured to be in deactivated states, and the third transistor and the fourth transistor are configured to be in activated states; and the activation states of the first transistor and the second transistor are configured to be switched at different times between the charge phase and the discharge phase.

2. The power supply circuit of claim 1, wherein the logic is configured to control the activation states such that:

the charge phase is configured to occur during a first period;

during a second period after the first period, the first transistor is configured to be in a deactivated state;

during a third period after the second period, the fourth transistor is configured to be in an activated state;

during a fourth period after the third period, the second transistor is configured to be in a deactivated state; and the discharge phase is configured to occur in a fifth period after the fourth period.

3. The power supply circuit of claim 2, wherein:

the first transistor is coupled between the input node and a first node;

the second transistor is coupled between the first node and the switching node;

the third transistor is coupled between the switching node and a second node; and the fourth transistor is coupled between the second node and the reference potential node.

4. The power supply circuit of claim 3, further comprising a flying capacitor having a first terminal coupled to the first node and a second terminal coupled to the second node, wherein the logic is configured to control the activation states such that:

during the second period, current is configured to flow from the reference potential node, across a body diode of the fourth transistor, across the flying capacitor, and across a channel of the second transistor, to the inductive element;

during the third period, current is configured to flow from the reference potential node, across a channel of the fourth transistor, across the flying capacitor, and across the channel of the second transistor, to the inductive element; and during the fourth period, current is configured to flow from the reference potential node, across the channel of the fourth transistor and across a body diode of the third transistor, to the inductive element.

5. The power supply circuit of claim 2, wherein:

the second transistor is coupled between the input node and a first node;

the first transistor is coupled between the first node and the switching node;

the fourth transistor is coupled between the switching node and a second node; and the third transistor is coupled between the second node and the reference potential node.

6. The power supply circuit of claim 5, further comprising a flying capacitor having a first terminal coupled to the first node and a second terminal coupled to the second node, wherein the logic is configured to control the activation states such that:

during the second period, current is configured to flow from the input node, across a channel of the second transistor, across the flying capacitor, and across a body diode of the fourth transistor, to the inductive element;

during the third period, current is configured to flow from the input node, across the channel of the second transistor, across the flying capacitor, and across a channel of the fourth transistor, to the inductive element; and during the fourth period, current is configured to flow from the reference potential node, across a body diode of the third transistor and across the channel of the fourth transistor, to the inductive element.

7. The power supply circuit of claim 1, further comprising a flying capacitor having:

a first terminal coupled to a first node between the first transistor and the second transistor; and a second terminal coupled to a second node between the third transistor and the fourth transistor.

8. The power supply circuit of claim 1, wherein the power supply circuit comprises a three-level buck converter configured to operate in a two-level buck converter mode.

9. The power supply circuit of claim 1, wherein the logic is configured to control the activation states such that during a transition from the charge phase to the discharge phase, the second transistor is configured to be deactivated after the first transistor is deactivated.

10. The power supply circuit of claim 9, wherein the logic is configured to control the activation states such that during the transition from the charge phase to the discharge phase, the second transistor is configured to be deactivated after the fourth transistor is activated, but before the third transistor is activated.

11. A method for operating a power supply circuit, comprising:

biasing a first transistor and a second transistor in activated states during a charge phase of the power supply circuit, the first transistor and the second transistor being coupled between an input node of the power supply circuit and a switching node of the power supply circuit, the switching node being coupled to an inductive element;

switching activation states of the first transistor and the second transistor at different times between the charge phase and a discharge phase; and biasing a third transistor and a fourth transistor in activated states during the discharge phase of the power supply circuit, the third transistor and the fourth transistor being coupled between a reference potential node of the power supply circuit and the switching node of the power supply circuit.

12. The method of claim 11, wherein:

the charge phase occurs during a first period;

switching the activation states includes:

biasing the first transistor in a deactivated state during a second period after the first period;

biasing the fourth transistor in an activated state during a third period after the second period; and biasing the second transistor in a deactivated state during a fourth period after the third period; and the discharge phase occurs in a fifth period after the fourth period.

13. The method of claim 12, wherein:

the first transistor is coupled between the input node and a first node;

the second transistor is coupled between the first node and the switching node;

the third transistor is coupled between the switching node and a second node; and the fourth transistor is coupled between the second node and the reference potential node.

14. The method of claim 13, wherein the power supply circuit further comprises a flying capacitor having a first terminal coupled to the first node and a second terminal coupled to the second node, wherein:

during the second period, current flows from the reference potential node, across a body diode of the fourth transistor, across the flying capacitor, and across a channel of the second transistor, to the inductive element;

during the third period, current flows from the reference potential node, across a channel of the fourth transistor, across the flying capacitor, and across the channel of the second transistor, to the inductive element; and during the fourth period, current flows from the reference potential node, across the channel of the fourth transistor and across a body diode of the third transistor, to the inductive element.

15. The method of claim 12, wherein:

the second transistor is coupled between the input node and a first node;

the first transistor is coupled between the first node and the switching node;

the fourth transistor is coupled between the switching node and a second node; and the third transistor is coupled between the second node and the reference potential node.

16. The method of claim 15, wherein the power supply circuit further comprises a flying capacitor having a first terminal coupled to the first node and a second terminal coupled to the second node, wherein:

during the second period, current flows from the input node, across a channel of the second transistor, across the flying capacitor, and across a body diode of the fourth transistor, to the inductive element;

during the third period, current flows from the input node, across the channel of the second transistor, across the flying capacitor, and across a channel of the fourth transistor, to the inductive element; and during the fourth period, current flows from the reference potential node, across a body diode of the third transistor and across the channel of the fourth transistor, to the inductive element.

17. The method of claim 11, wherein the power supply circuit further comprises a flying capacitor having:

a first terminal coupled to a first node between the first transistor and the second transistor; and a second terminal coupled to a second node between the third transistor and the fourth transistor.

18. The method of claim 11, wherein the power supply circuit comprises a three-level buck converter operating in a two-level buck converter mode.

19. The method of claim 11, wherein switching the activation states comprises biasing the first transistor in a deactivated state after biasing the second transistor in a deactivated state, during a transition from the charge phase to the discharge phase.

20. The method of claim 19, wherein biasing the first transistor in the deactivated state comprises biasing the first transistor in a deactivated state after biasing the third transistor in an activated state, but before biasing the fourth transistor in an activated state, during the transition from the charge phase to the discharge phase.

21. An apparatus for operating a power supply circuit, comprising:

means for biasing a first transistor and a second transistor in activated states during a charge phase of the power supply circuit, the first transistor and the second transistor being coupled between an input node of the power supply circuit and a switching node of the power supply circuit;

means for switching activation states of the first transistor and the second transistor at different times between the charge phase and a discharge phase; and means for biasing a third transistor and a fourth transistor in activated states during the discharge phase of the power supply circuit, the third transistor and the fourth transistor being coupled between a reference potential node of the power supply circuit and the switching node of the power supply circuit.

22. The apparatus of claim 21, wherein:

the charge phase occurs during a first period;

means for switching the activation states includes:

means for biasing the first transistor in a deactivated state during a second period after the first period;

means for biasing the fourth transistor in an activated state during a third period after the second period; and means for biasing the second transistor in a deactivated state during a fourth period after the third period; and the discharge phase occurs in a fifth period after the fourth period.

23. The apparatus of claim 22, wherein:

the first transistor is coupled between the input node and a first node;

the second transistor is coupled between the first node and the switching node;

the third transistor is coupled between the switching node and a second node; and the fourth transistor is coupled between the second node and the reference potential node.

24. The apparatus of claim 22, wherein:

the second transistor is coupled between the input node and a first node;

the first transistor is coupled between the first node and the switching node;

the fourth transistor is coupled between the switching node and a second node; and the third transistor is coupled between the second node and the reference potential node.

* * * * *